United States Patent
Sugiura

(10) Patent No.: US 8,072,030 B2
(45) Date of Patent: Dec. 6, 2011

(54) SEMICONDUCTOR DEVICE

(75) Inventor: Masayuki Sugiura, Yokohama (JP)

(73) Assignee: Kabushiki Kaisha Toshiba, Toyko (JP)

( * ) Notice: Subject to any disclaimer, the term of this patent is extended or adjusted under 35 U.S.C. 154(b) by 360 days.

(21) Appl. No.: 12/404,545

(22) Filed: Mar. 16, 2009

(65) Prior Publication Data
US 2009/0283832 A1 Nov. 19, 2009

(30) Foreign Application Priority Data

May 16, 2008 (JP) ................................. 2008-129234

(51) Int. Cl.
*H01L 23/62* (2006.01)

(52) U.S. Cl. ........ 257/355; 257/359; 257/360; 257/401; 257/E23.07; 257/E29.12; 361/91.5; 361/56; 361/111

(58) Field of Classification Search .................. 257/206, 257/401, E23.07, E23.151, E29.026, E29.12, 257/355–357, 360, 362, 363, 389; 361/91.5, 361/56, 111
See application file for complete search history.

(56) References Cited

U.S. PATENT DOCUMENTS

| | | | | |
|---|---|---|---|---|
| 4,864,380 A | * | 9/1989 | Plus et al. | 257/351 |
| 5,001,528 A | * | 3/1991 | Bahraman | 257/351 |
| H1435 H | * | 5/1995 | Cherne et al. | 257/347 |
| 5,920,093 A | * | 7/1999 | Huang et al. | 257/347 |
| 5,973,364 A | * | 10/1999 | Kawanaka | 257/347 |
| 6,258,672 B1 | * | 7/2001 | Shih et al. | 438/275 |
| 6,545,322 B2 | * | 4/2003 | Ishii et al. | 257/360 |
| 6,693,326 B2 | * | 2/2004 | Adan | 257/347 |
| 6,794,717 B2 | * | 9/2004 | Matsumoto et al. | 257/347 |
| 7,092,227 B2 | * | 8/2006 | Ker et al. | 361/56 |
| 7,649,229 B2 | * | 1/2010 | Kato | 257/360 |
| 7,910,993 B2 | * | 3/2011 | Brindle et al. | 257/347 |
| 2005/0045958 A1 | * | 3/2005 | Ichikawa | 257/362 |
| 2006/0157791 A1 | * | 7/2006 | Lee et al. | 257/357 |
| 2006/0273398 A1 | * | 12/2006 | Suzuki et al. | 257/355 |

FOREIGN PATENT DOCUMENTS

| | | |
|---|---|---|
| JP | 2002-246600 | 8/2002 |
| JP | 2004-140148 | 5/2004 |
| JP | 2006-120900 | 5/2006 |
| JP | 2006-140371 | 6/2006 |

* cited by examiner

*Primary Examiner* — Meiya Li
(74) *Attorney, Agent, or Firm* — Oblon, Spivak, McClelland, Maier & Neustadt, L.L.P.

(57) ABSTRACT

A semiconductor device, which is connected to a protected device and protects a protected device, includes a semiconductor layer provided on an insulating film; a plurality of source layers which is formed in the semiconductor layer and extends in a first direction; a plurality of drain layers which is formed in the semiconductor layer and extends along with the source layers; a plurality of body regions which is provided between the source layers and the drain layers in the semiconductor layer and extends in the first direction; and at least one body connecting part connecting the plurality of body regions, wherein a first width between the source layer and the drain layer at a first position is larger than a second width between the source layer and the drain layer at a second position, the second position is closer to the body connecting part than the first position.

15 Claims, 18 Drawing Sheets

FIRST EMBODIMENT

SECOND EMBODIMENT

FOURTH EMBODIMENT

SEMICONDUCTOR DEVICE

CROSS REFERENCE TO RELATED APPLICATIONS

This application is based upon and claims the benefit of priority from the prior Japanese Patent Application No. 2008-129234, filed on May 16, 2008, the entire contents of which are incorporated herein by reference.

BACKGROUND OF THE INVENTION

1. Field of the Invention

The present invention relates to a semiconductor device. For example, the invention relates to an electro static discharge (ESD) protective device.

2. Related Art

Conventionally, a gate grounded NMOS (GGNMOS) or a gate connected NMOS (GCNMOS) has been used as an ESD protective device. In the GGNMOS or GCNMOS, a gate electrode is connected to a source electrode directly or via a resistor. That is, a field effect transistor (FET) is diode-connected in the GGNMOS or GCNMOS.

When a voltage is applied to such a device in the forward direction of the diode, the parasitic bipolar transistor does not turn on. For this reason, an internal resistance of the protective device is not lowered; as a result, a breakdown of the protective device may be caused by heat generation. Particularly, the GGNMOS or GCNMOS formed on a silicon-on-insulator (SOI) structure has such poor heat dissipation, that an ESD resistance is low in forward bias. In order to deal with this problem, it is necessary that the size of the ESD device is enlarged, or that an additional protective device is provided. Thus, the related-art ESD protective device is not suitable for miniaturization.

SUMMARY OF THE INVENTION

A semiconductor device connected to a protected device and protecting a protected device by using a portion between a source layer and a drain layer as a discharge path, the semiconductor device according to an embodiment of the present invention comprises: an insulating film; a semiconductor layer provided on the insulating film; a plurality of source layers which is formed in the semiconductor layer and extends in a first direction; a plurality of drain layers which is formed in the semiconductor layer and extends along with the source layers; a plurality of body regions which is provided between the source layers and the drain layers in the semiconductor layer and extends in the first direction; and at least one body connecting part connecting the plurality of body regions, wherein a first width between the source layer and the drain layer at a first position is larger than a second width between the source layer and the drain layer at a second position, the second position is closer to the body connecting part than the first position.

DETAILED DESCRIPTION OF THE INVENTION

Embodiments according to the present invention will now be described with reference to the accompanying drawings. The embodiments are not intended to limit the scope of the invention.

First Embodiment

Figure 1:
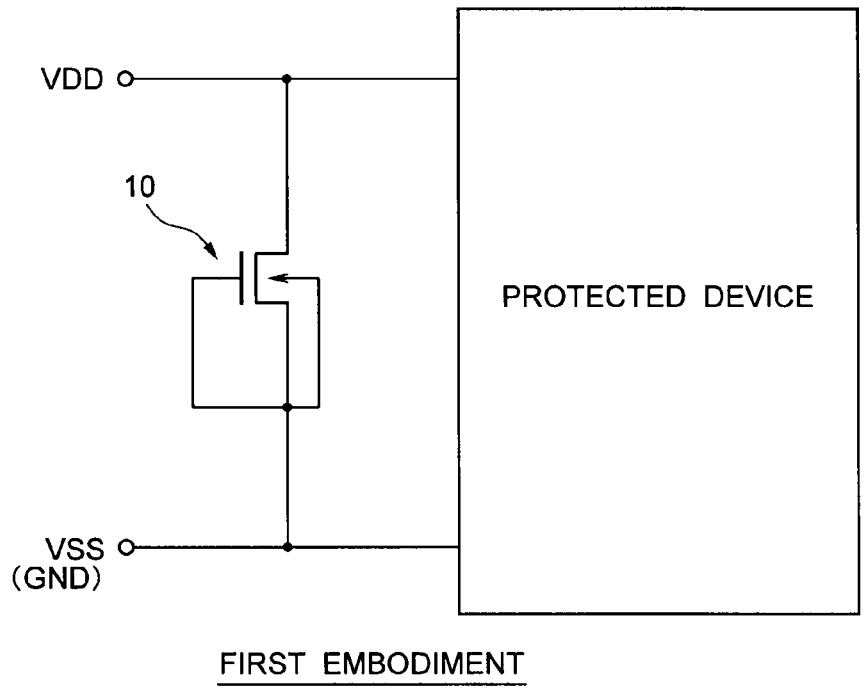
FIG. 1 is a view showing an ESD protective device (hereinafter also referred to as a protective device) according to a first embodiment of the present invention.

FIG. 1 is a view showing an ESD protective device (hereinafter also referred to as a protective device) according to a first embodiment of the present invention. A protective device 10 is connected between an input terminal (or an output terminal) and a ground terminal of a protected device that should be protected. For instance, the drain of the protective device 10 is connected to an input terminal (a power-supply potential VDD), and the source of the protective device 10 is connected to a ground terminal (a grounding potential VSS). The gate of the protective device 10 is connected to the source. A body region (a back gate) of the protective device 10 is connected to the source. The protective device 10 is configured so as to protect the protected device using a portion between a source layer and a drain layer as a discharge path.

Figure 2:
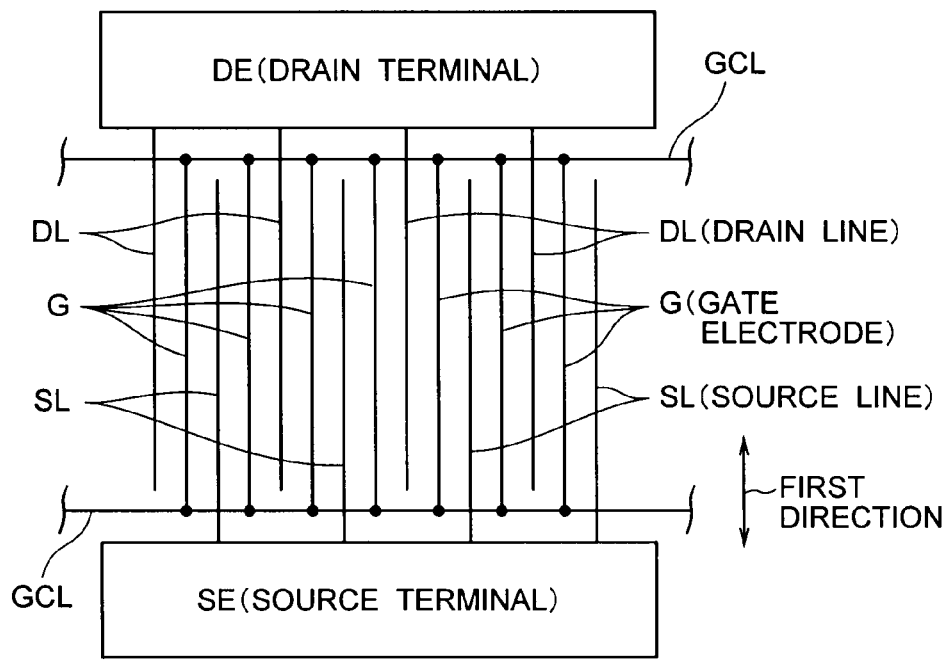
FIG. 2 is a plan view schematically showing the ESD protective device.

FIG. 2 is a plan view schematically showing the ESD protective device. The protective device 10 includes a plurality of source lines SL and a plurality of drain lines DL extending in a first direction extending between a drain terminal DE and a source terminal SE. The source lines SL and the drain lines DL are arrayed alternately in a direction perpendicular to the first direction. The source lines SL are connected to the source terminal SE, and the drain lines DL are connected to the drain terminal DE. Gate electrodes G are provided so as to extend in the first direction between the source lines SL and the drain lines DL. One ends of the gate electrodes G extending in the first direction are connected with each other by a gate connecting line GCL. Another ends of the gate electrodes G are connected with each other by another gate connecting line GCL.

Figure 3:
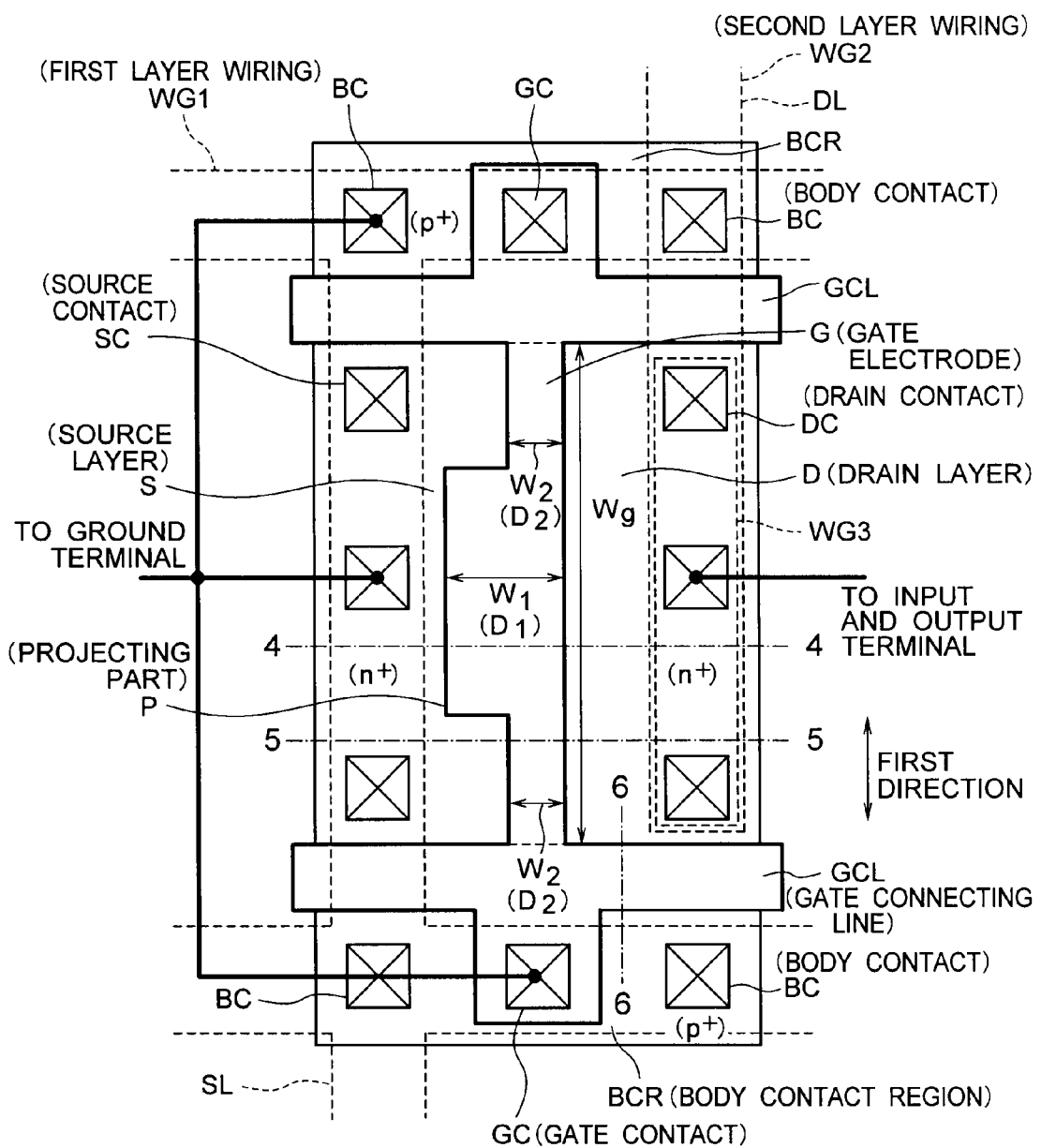
FIG. 3 is a plan view showing one of the gate electrodes G, and a source region and a drain region provided on both sides of the gate electrode G.
Figure 4:
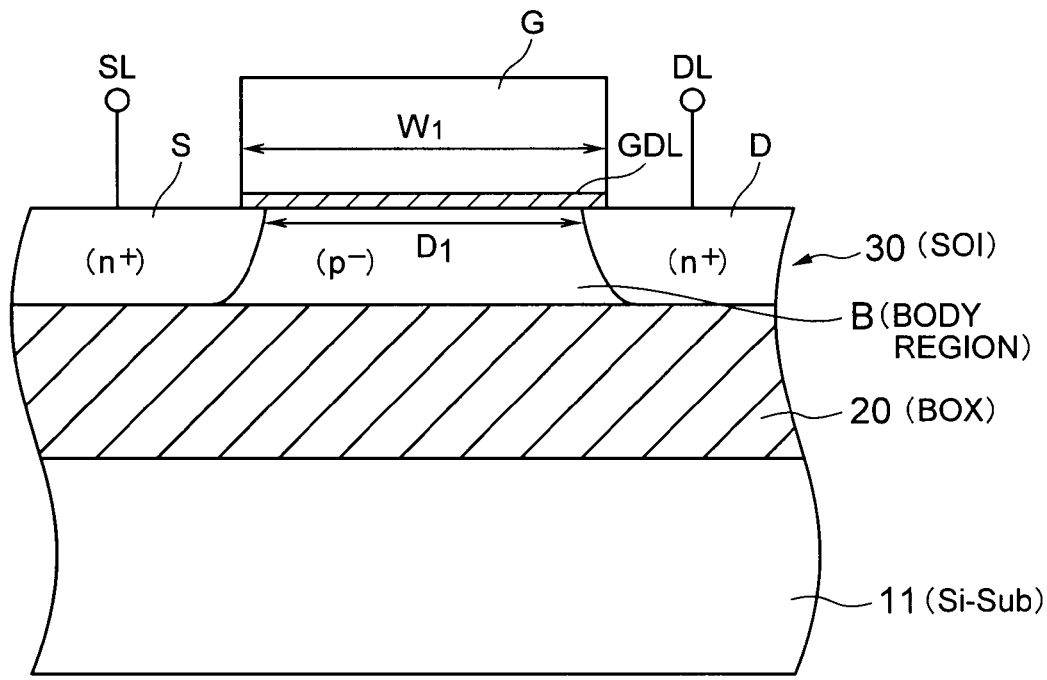
FIG. 4 is a cross-sectional view taken along the line 4-4 of FIG. 3.
Figure 5:
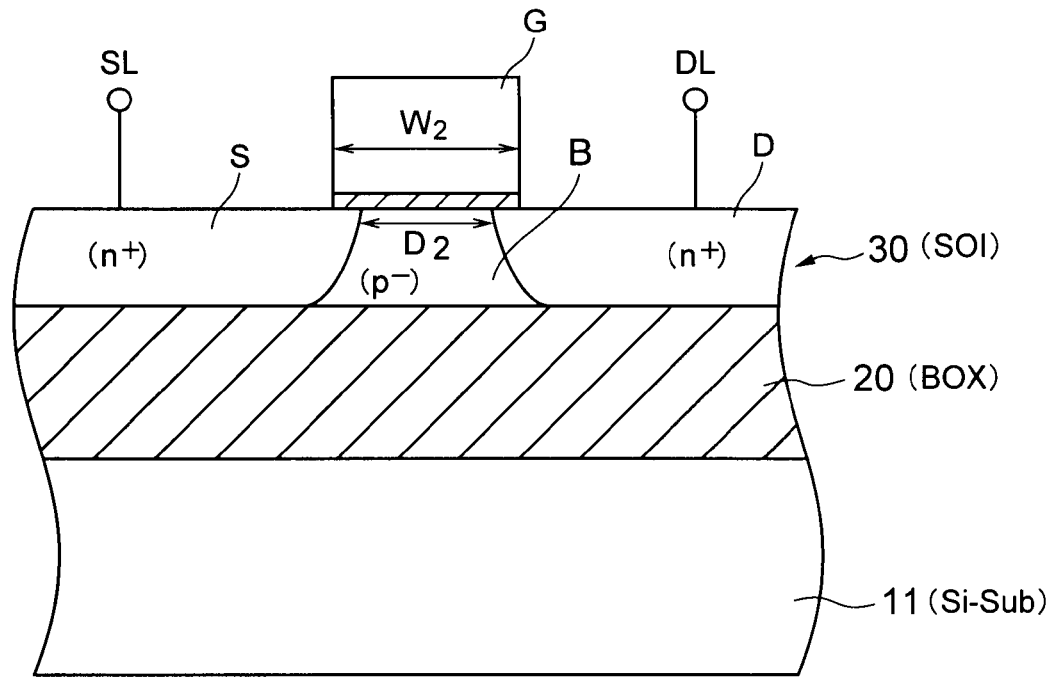
FIG. 5 is a cross-sectional view taken along the line 5-5 of FIG. 3.
Figure 6:
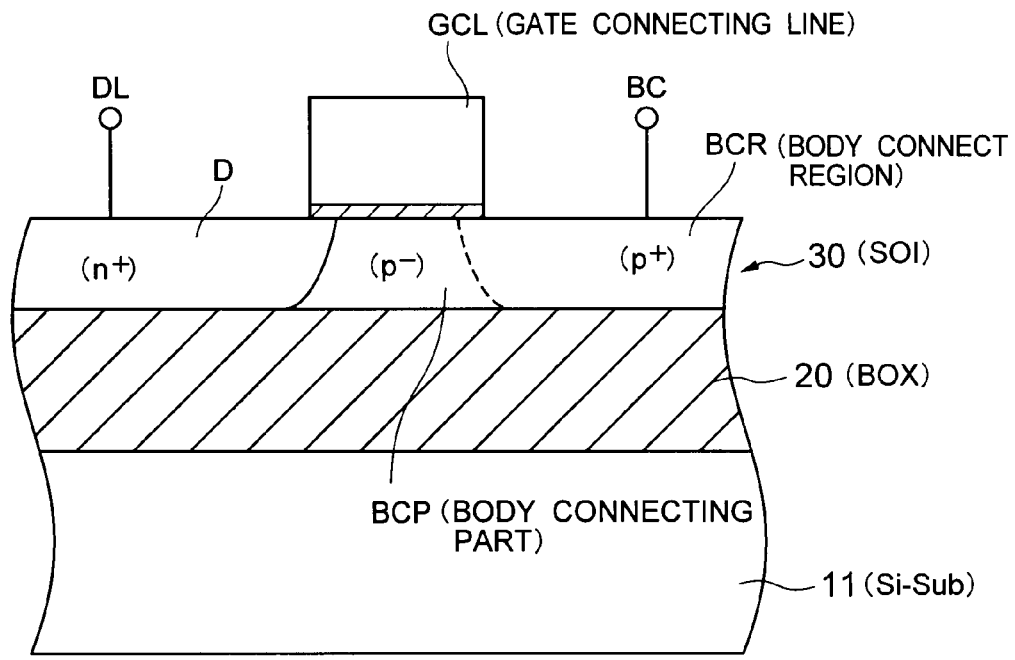
FIG. 6 is a cross-sectional view taken along the line 6-6 of FIG. 3.

FIG. 3 is a plan view showing one of the gate electrodes G, and a source region and a drain region provided on both sides of the gate electrode G. FIG. 3 also shows a relationship of connections between the gate electrode G, a source layer S and a drain layer D. FIG. 4 is a cross-sectional view taken along the line 4-4 of FIG. 3. FIG. 5 is a cross-sectional view taken along the line 5-5 of FIG. 3. FIG. 6 is a cross-sectional view taken along the line 6-6 of FIG. 3.

As shown in FIG. 4, the protective device 10 includes a silicon substrate 11, a buried oxide (BOX) layer 20 provided on the silicon substrate 11, and an SOI layer 30 as a semiconductor layer provided on the BOX layer 20. The source layer S of $n^+$ type and the drain layer D of $n^+$ type are formed in the SOI layer 30. A body region B of $p^-$ type is provided at a portion between the source layer S and the drain layer D. A gate dielectric film GDL is formed on the body region B and further, the gate electrode G is provided on the gate dielectric film GDL. The source layer S and the drain layer D are formed in a self-aligned manner using the gate electrode G as a mask. Accordingly, the body region B is formed right under the gate electrode G and is overlapped with the gate electrode G. The planar shape of the body region B is substantially the same as the planar shape of the gate electrode G. The body region B is, therefore, not visible in the plan view of FIG. 3.

As shown in FIGS. 2 and 3, the source layer S and the drain layer D extend in the first direction. The gate electrode G and the body region B extend in the first direction at the position between the source layer S and the drain layer D. Ends of the gate electrode G are respectively connected to ends of neighboring gate electrodes G electrically with the gate connecting lines GCL extending in a direction perpendicular to the first direction. Similarly, ends of the body region B are respectively connected to ends of neighboring body regions B with body connecting parts BCP (see FIG. 6) extending in a direction perpendicular to the first direction. Therefore, one unit of the gate electrode G and the gate connecting lines GCL has an H shape, and one unit of the body region B and the body connecting parts BCP also has an H shape. Each body connecting part BCP is a $p^-$ type diffusion layer that is formed at the same time as the body region B, and connects a plurality of neighboring body regions B electrically. The body connecting part BCP is formed right under one of the gate connecting lines GCL.

Furthermore, a body contact region BCR of $p^+$ type is formed so as to lie adjacent to the body connecting part BCP. The body contact region BCR is a $p^+$ type diffusion layer formed on the opposite side of the source layer S and the drain layer D with the body connecting part BCP interposed therebetween. The body contact region BCR is provided so as to connect body contacts BC to the body region B electrically. The body region B, the body connecting part BCP, and the body contact region BCR are also collectively called as a back gate region.

The plan view and the cross-sectional views shown in FIGS. 3 to 6 show the connection relation of each electrode schematically. Since various methods are available for providing this connection relation, details of an interlayer dielectric film, contact, and wiring are omitted herein.

As shown in FIG. 3, gate contacts GC are provided at the external sides of the gate connecting lines GCL placed at both ends of the gate electrode G extending in the first direction. The body contacts BC are provided at the external sides of the body connecting parts BCP placed at both ends of the body region B extending in the first direction, and are not provided at the middle part of the body region B.

A width W1 at the middle part of the gate electrode G in the first direction is formed to be larger than a width W2 at both end parts of the gate electrode G. Since the body region B has substantially the same pattern on a plane with the gate electrode G as mentioned above, the same can be said for the body region B as the gate electrode G. Namely, a width D1 at the middle part of the body region B in the first direction is larger than a width D2 at both end parts of the body region B. Referring to FIGS. 4 and 5, it is found that the width D1 at the middle part of the body region B is larger than the width D2 at both end parts of the body region B. That is, the first width D1 between the source layer S and the drain layer D at the middle part of the body region B, which is comparatively distant from the body connecting part BCP, is larger than the second width D2 between the source layer S and the drain layer D, which is comparatively close to the body connecting part BCP. That is further to say, the channel length of an FET at the middle part of the body region B, which is comparatively distant from the body connecting part BCP, is larger than the channel length at a position that is comparatively close to the body connecting part BCP. Thus, both of the gate electrode G and the body region B have shapes projecting toward the source layer S side at the middle part thereof. Hereinafter, the projecting middle part of the body region B is also called as a projecting part P. The projecting part P is a portion projecting, within the surface of the SOI layer 30 and further than the end of the body region B, in a direction perpendicular to the first direction.

As shown in FIG. 6, the body contact region BCR is formed to have $p^+$ conductivity. Since the body connecting part BCP is interposed between the body contact region BCR of $p^+$ type and the drain layer D (or the source layer S) of $n^+$ type, reductions of a breakdown voltage between the body contact region BCR and the drain layer D, and a breakdown voltage between the body contact region BCR and the source layer S can be suppressed.

As shown in FIG. 3, the source layer S is connected to one of the source lines SL via source contacts SC. The drain layer D is connected to one of the drain lines DL via drain contacts DC. A first interlayer dielectric film (not shown) is deposited on the source layer S, the drain layer D, and the gate electrode G. The drain contacts DC, the source contacts SC, the gate contacts GC, and the body contacts BC are formed so as to penetrate the first interlayer dielectric film. Furthermore, first layer wiring WG 1 is formed on the first interlayer dielectric film. The first layer wiring WG 1 is formed so as to connect the source contacts SC, the gate contacts GC, and the body contacts BC to the source terminal SE. In addition, wiring WG 3 that is at the same layer level as the first layer wiring WG 1 and has another pattern connects a plurality of drain contacts DC connected to the same drain layer D. In this arrangement, the first layer wiring WG 1 connected to the source layer S is insulated from the wiring WG 3 connected to the drain layer D.

After a second interlayer dielectric film (not shown) is deposited on the first layer wiring WG 1, the drain contacts DC penetrating the second interlayer dielectric film are formed. That is, the drain contacts DC penetrate the first and second interlayer dielectric films via the wiring WG 3, which connects the drain contacts DC. Second layer wiring WG 2 is formed on the second interlayer dielectric film. The second layer wiring WG 2 is formed so as to connect the drain contacts DC to the drain terminal DE. Here, the second layer wiring WG 2 is insulated from the first layer wiring WG 1, the source contacts SC, the gate contacts GC, and the body contacts BC. The first layer wiring WG 1 provides connection to the source contacts SC, the gate contacts GC, and the body contacts BC.

The drain terminal DE is connected to the input terminal or the output terminal of the protected device, and the source terminal SE is grounded.

In the present embodiment, the gate electrode G is connected to the source layer S electrically. Thus, a FET part of the protective device 10 operates in a similar manner to a GGNMOS. For example, when a positive ESD voltage is applied to the drain layer D, a lateral parasitic bipolar transistor formed with the drain layer D, the body region B, and the source layer S turns on. This enables the protective device 10 to provide a low-resistance discharge path to the protected device. On the contrary, when a negative ESD voltage is applied to the drain layer D, a forward bias is applied to a pn diode formed between the body and the drain. This allows providing a discharge path to the protected device. In addition to this, carriers are injected to the body region B (the back gate region) as the base of the parasitic bipolar transistor, so that the parasitic bipolar transistor of the FET part of the protective device 10 turns on. Consequently, even if the negative ESD voltage is applied to the drain layer D, the protective device 10 provides a low-resistance discharge path to the protected device.

Furthermore, in the present embodiment, the width D1 at the middle part of the body region B is larger than the width D2 at both end parts of the body region B. Therefore, even if the body region B is elongated in the first direction (that is, even if the gate width is widen), a resistance value at the middle part of the body region B can be reduced. When the resistance value at the middle part of the body region B is lowered, charges (carriers) injected to a base region of the parasitic bipolar transistor at the middle part thereof are easily drawn out of the middle part of the body region B to the body connecting parts BCP via the ends of the body region B. In addition, since the base length of the parasitic bipolar transistor is elongated at the middle part of the body region B, a current amplification factor β of the parasitic bipolar transistor is reduced. Therefore, the parasitic bipolar transistor at the middle part is unlikely to turn on. Furthermore, due to the reduction of the resistance value at the middle part of the body region B, an on-voltage can be prevented from varying. Thus, local current concentration in the body region B can be prevented. To put it another way, by increasing the length of the middle part of the body region B in the first direction (in the gate width direction), a timing at which parasitic bipolar transistors at the middle part of the body region B turn on gets closer to a timing at which parasitic bipolar transistors at the ends of the body region B turn on. Thus, when the ESD voltage is applied, parasitic bipolar transistors in a wide region turn on at the substantially same time, and a current does not concentrate locally in the body region B, so that local thermal destruction of the body region B can be prevented. As a result, the present embodiment can improve the ESD resistance of the protective device 10.

Figure 7:
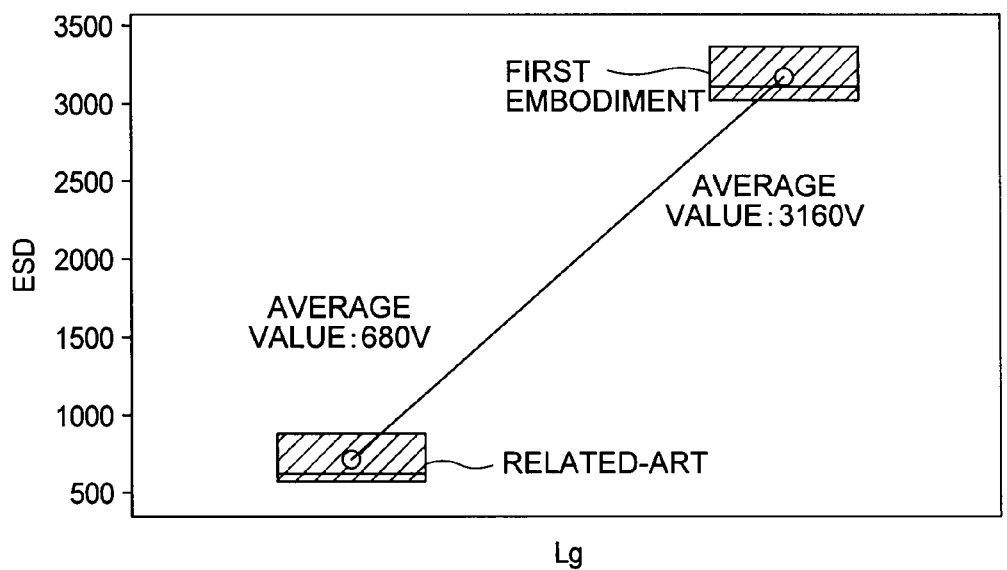
FIG. 7 is a graph showing the ESD resistances of the related-art protective device (GGNMOS) described in JP-A 2002-246600(KOKAI), and of the protective device 10 (GGNMOS) according to the present embodiment.
Figure 8:
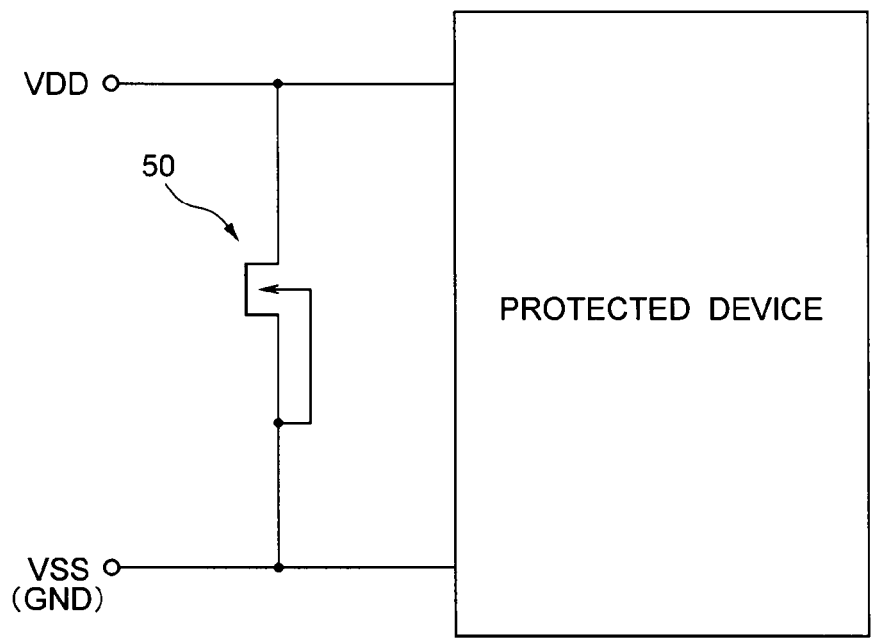
FIGS. 8 to 13 are views showing an ESD protected device 50 according to a second embodiment of the present invention.

FIG. 7 is a graph showing the ESD resistances of the related-art protective device (GGNMOS) described in JP-A 2002-246600(KOKAI), and of the protective device 10 (GGNMOS) according to the present embodiment. FIG. 7 shows a positive ESD resistance in a human body model (HBM).

The protective device 10 according to the present embodiment used in this experiment has a gate width Wg (see FIG. 3) of approximately 10 μm, a width at the middle part of the gate electrode G (a gate length) of approximately 1 μm, a width at the ends of the gate electrode G (a gate length) of approximately 0.5 μm, with 32 gate electrodes G connected in parallel between the gate connecting lines GCL. In this case, the number of body regions B connected in parallel between the body connecting parts BCP is also 32, and the total gate width is approximately 320 μm.

The width of the gate electrode G (the gate length) of the related-art protective device used in this experiment is a constant width of approximately 0.5 μm. Other constitutions of the related-art protective device are similar to the constitutions of the protective device 10.

The positive ESD resistance of the related-art protective device was approximately 680 V. The positive ESD resistance of the protective device 10 according to the present embodiment was approximately 3160 V, which is more than four times of the positive ESD resistance of the related-art protective device. Thus, the GGNMOS according to the present embodiment has a higher ESD resistance than that of the related-art GGNMOS.

Generally, in a GGNMOS, since the body region is grounded at an end of the body region where the body contact is formed, an electric potential at the end of the body region is fixed. Thus, the parasitic bipolar transistor at the end of the body region is unlikely to be switched to an on state. That is, holes injected to the body region flow out to the body contact, so that a base electric potential of the parasitic bipolar transistor at the end of the body region does not increase to be an on-voltage.

On the other hand, while an electric potential at the middle part of the body region B is fixed, the end of the body region B lies between the body region B and the body connecting part BCP. The electric potential at the middle part of the body region is therefore prone to fluctuate compared to the potential at the ends of the body region, and holes are comparatively prone to remain at the middle part of the body region. Therefore, the parasitic bipolar transistor at the middle part of the body region is comparatively prone to turn on.

In the related-art GGNMOS, the width of the body region (the gate length) is constant, so that parasitic bipolar transistors at the middle part of the body region first turn on. Therefore, the current concentrates on the middle part of the body region locally, thereby causing thermal destruction.

On the other hand, in the GGNMOS according to the present embodiment, the width at the middle part of the body region (the gate length) is larger than the width at the ends of the body region, so that the current does not concentrate on the middle part of the body region B locally. As a result, the ESD resistance of the protective device 10 is increased.

According to the present embodiment, a high resistance against the ESD can be realized. In addition, since an additional device is unnecessary, the protective device according to the present embodiment is advantageous to miniaturization.

In this embodiment, the gate electrode G may be connected to the source line SL via a resistor. By means of increasing the resistance, a snapback voltage can be reduced, while the ESD resistance is maintained. The snapback voltage is a drain voltage when a current flows out between the source and the drain of the protective device 10. By means of reducing the snapback voltage, the protective device 10 can protect a protected device even if the protected device has a low ESD resistance.

Second Embodiment

FIGS. 8 to 13 are views showing an ESD protected device 50 according to a second embodiment of the present invention. The second embodiment is different from the first embodiment in not having a gate electrode. Other constitutions of the second embodiment may be the same as the constitutions of the first embodiment. Since the gate electrode G is not provided, the first layer wiring WG 1 is connected to the source contacts SC and the body contacts BC. FIGS. 8 to 13 correspond to FIGS. 1 to 6, respectively, of the first embodiment. Even if no gate electrode is provided like in the second embodiment, high ESD resistance is achieved similar to the first embodiment. Therefore, the second embodiment can offer similar advantageous effects to the first embodiment.

Modifications of First and Second Embodiments

Figure 14:
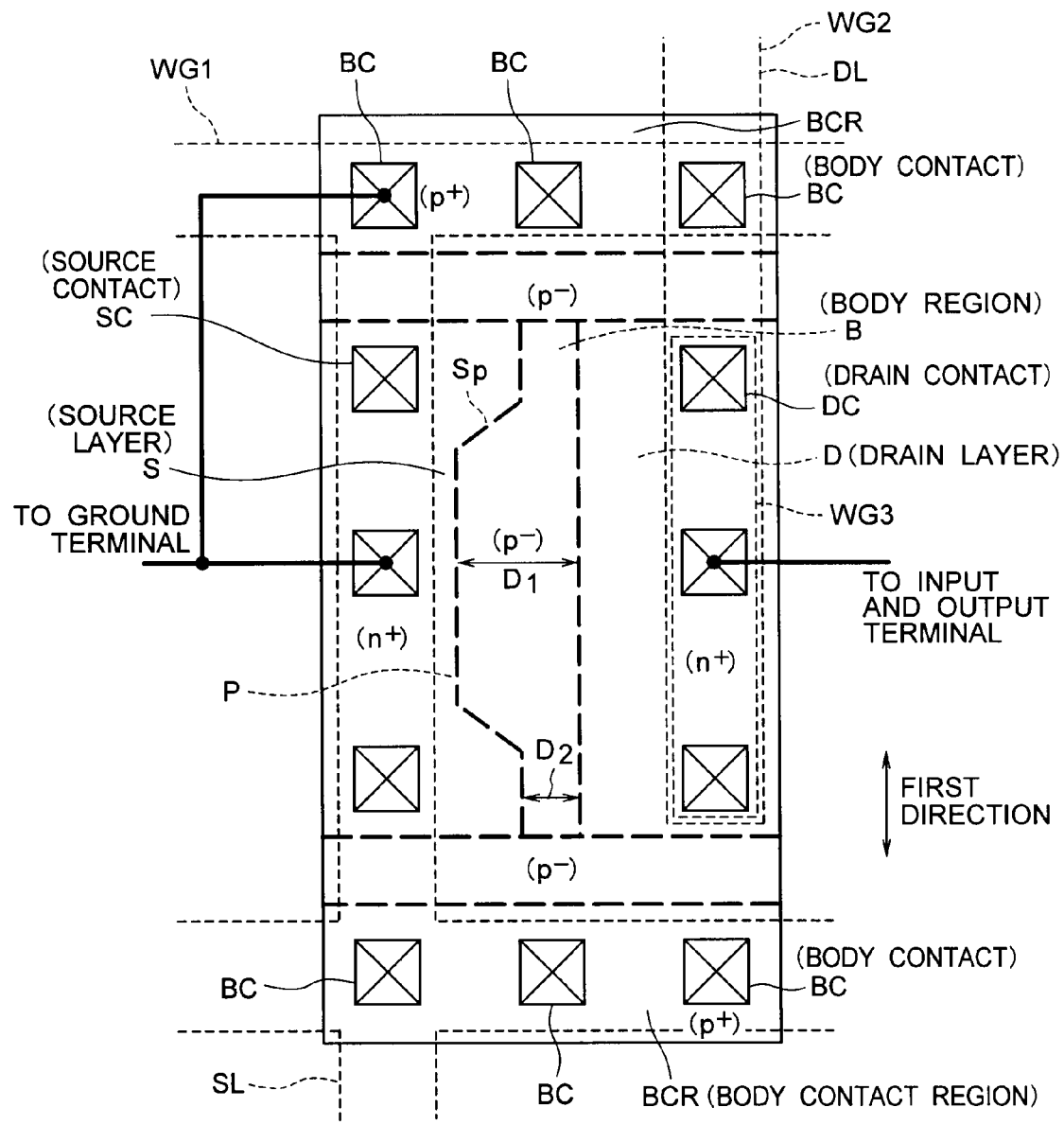
FIGS. 14 to 18 are plan views of a body region according to modifications of the first and second embodiments.
Figure 15:
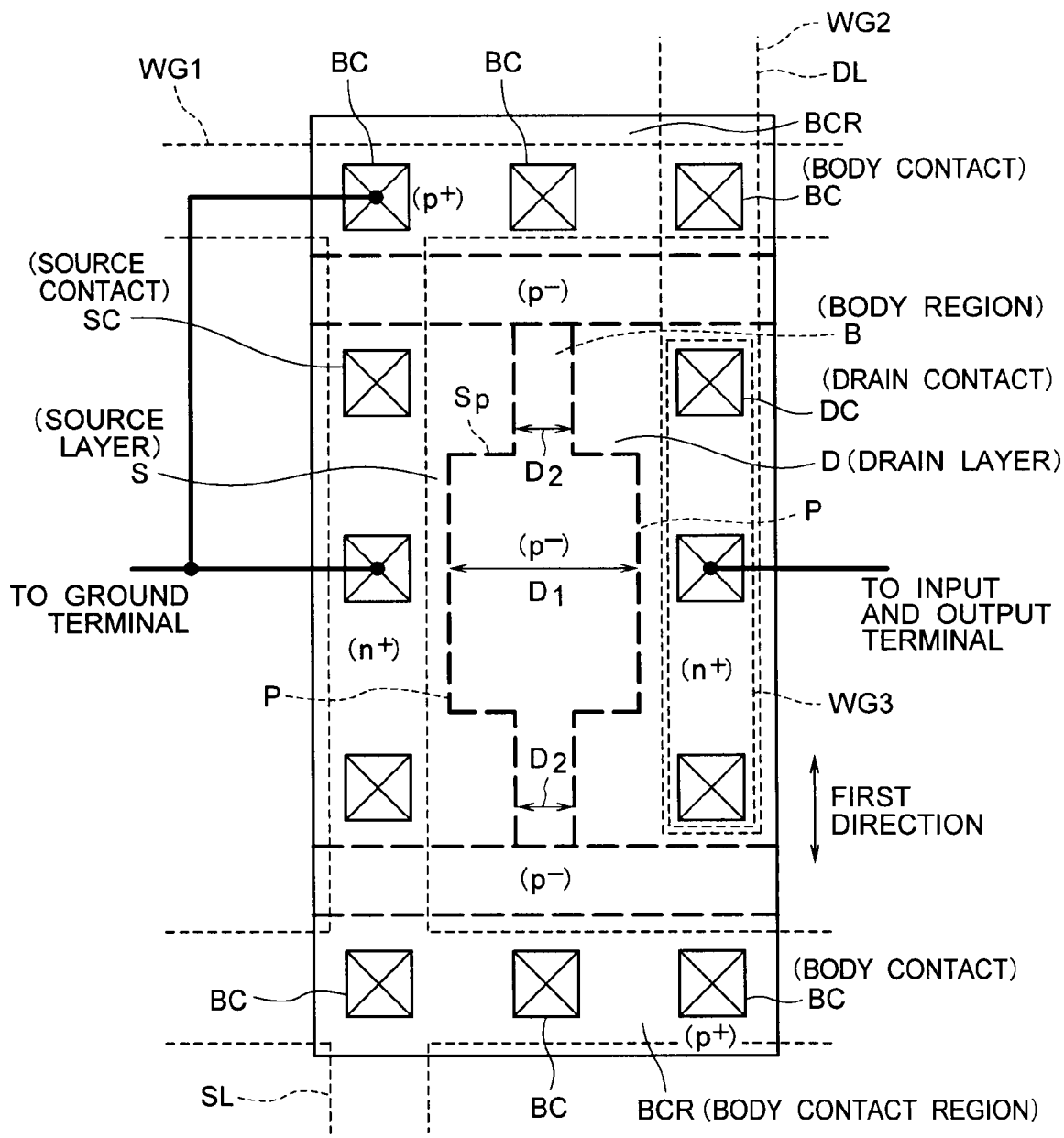
Figure 16:
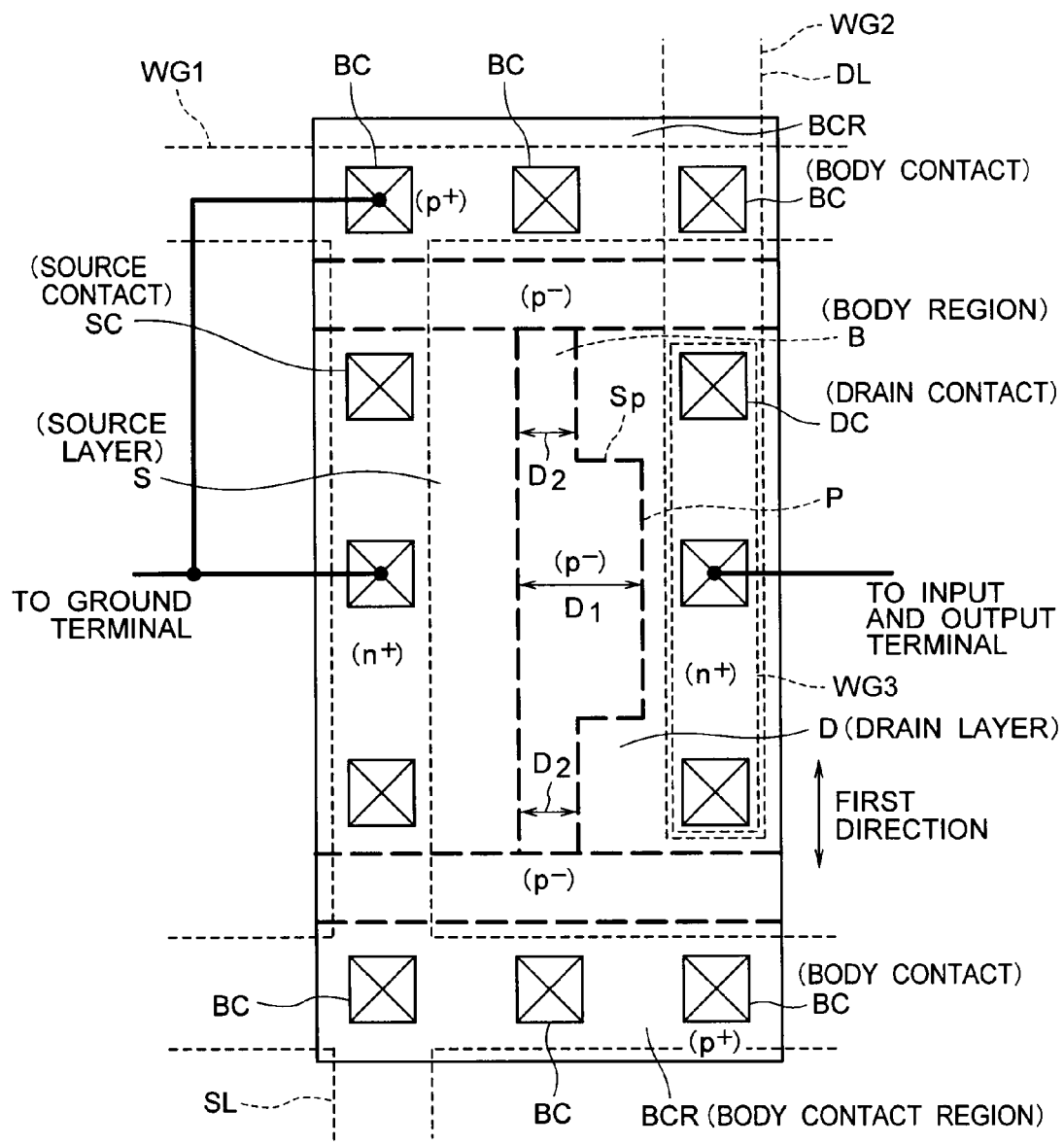

FIGS. 14 to 18 are plan views of a body region according to modifications of the first and second embodiments. As shown in FIG. 14, a side Sp of the projecting part P of the body region B may be formed in a tapered shape so as to avoid an electric field concentration. The side Sp of the projecting part P inclines at an angle to a projecting direction (a direction perpendicular to the first direction) of the projecting part P of the body region B. An inclination angle of the side Sp of the projecting part P is, for example, 45 degrees. As shown in FIG. 15, the projecting part P of the body region B may project not only toward the source side but also toward the drain side. As shown in FIG. 16, the projecting part P of the body region B may project toward the drain side alone.

Meanwhile, in FIG. 14, an ESD voltage is applied to the drain layer D, so that the electric field concentration on the projecting part can be avoided by forming a projecting part of the body region B at the source side alone. However, in the case where the electric field concentration on the projecting part poses no problem, the body region B may be shaped as shown in FIG. 15 or 16.

Figure 17:
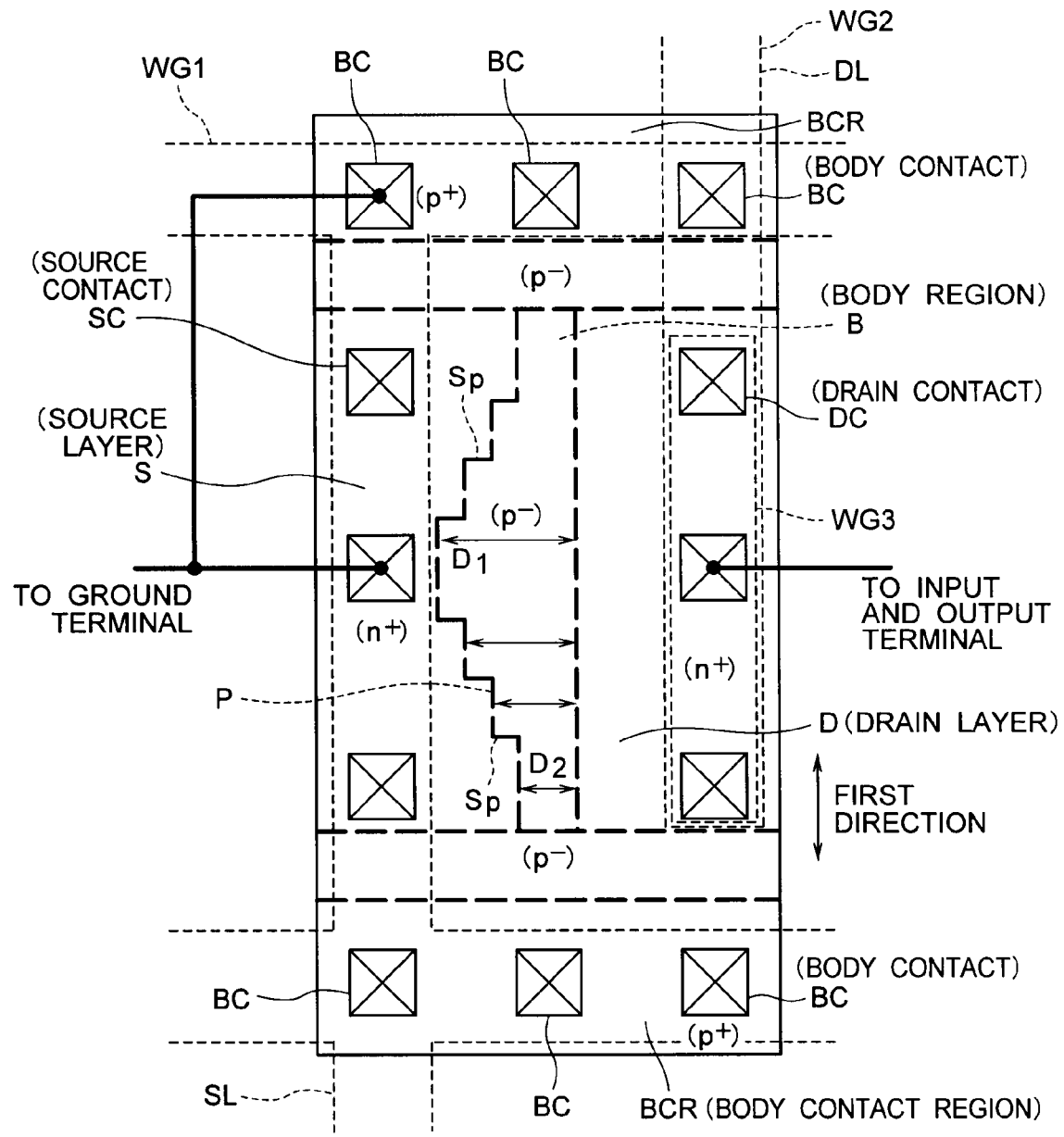
Figure 18:
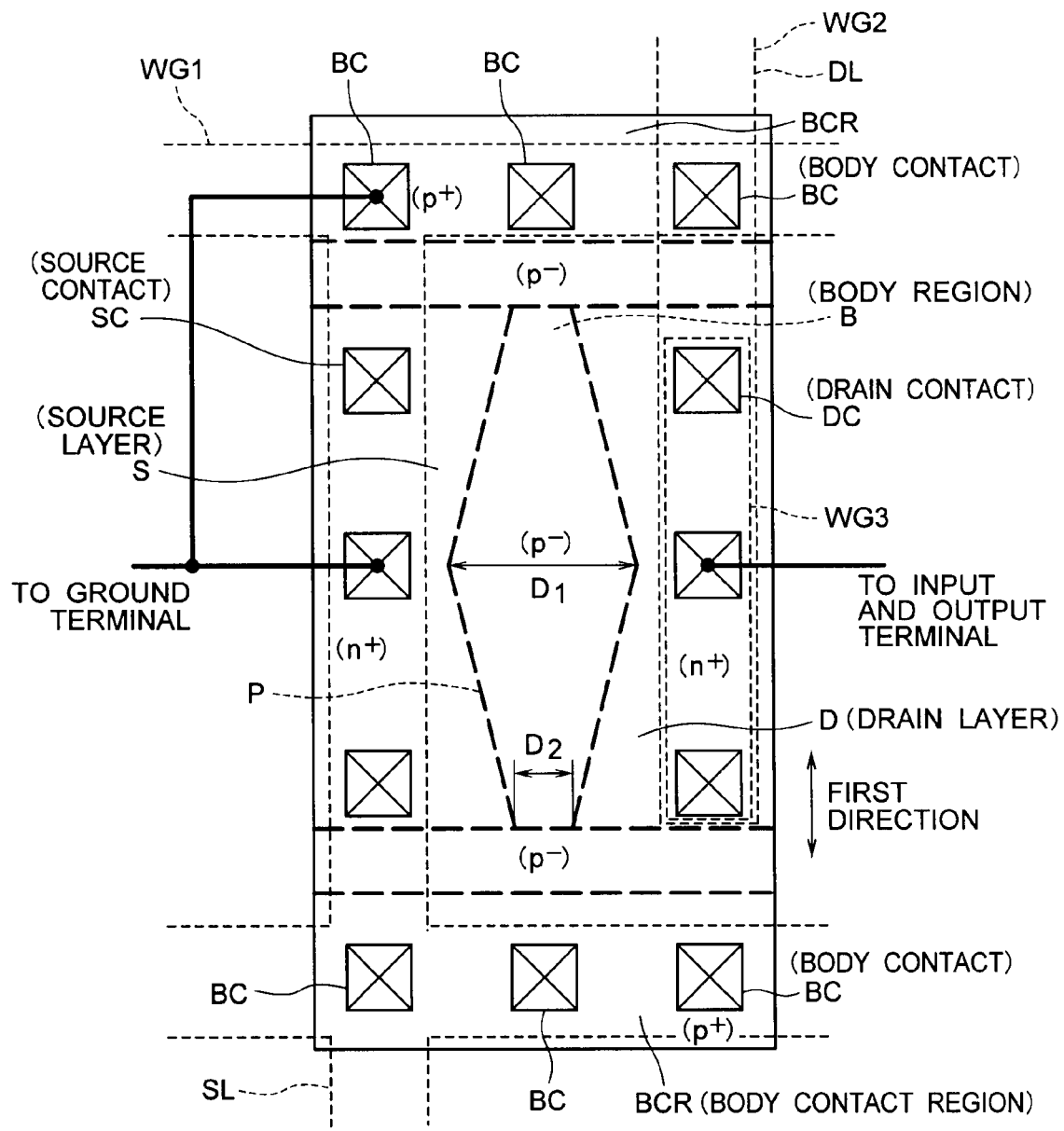

As shown in FIG. 17, the width of the body region B (the gate length) may be varied in multiple steps. That is, the side Sp of the projecting part P may be formed in a staircase pattern to vary the width of the body region B (the gate length) in a stepwise shape. The side Sp of the projecting part P in FIGS. 15 and 16 may be a staircase pattern. Furthermore, as shown in FIG. 18, two sides of the body region B extending in the first direction are inclined in a tapered shape so as to gradually narrow the width of the body region B (the gate length) from the center part toward the end. Therefore, the body region B may have a lozenge shape in plain view.

The length of the projecting part in the first direction is not particularly limited, however, if the length is too short, there is a possibility that an enhancing effect of the ESD resistance is reduced. Accordingly, the length of the projecting part in the first direction requires a certain length (for example, approximately a half of the length of the body region B in the first direction).

Third Embodiment

Figure 19:
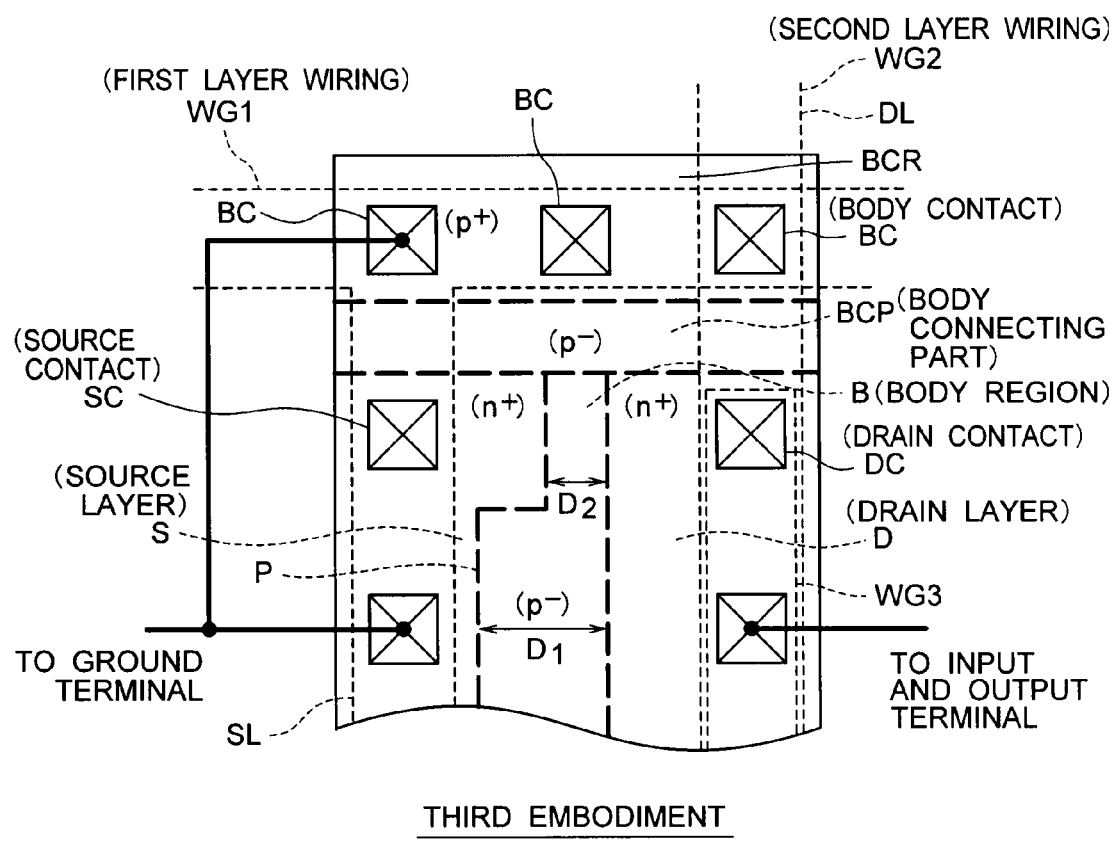
FIG. 19 is a plan view showing the body region B, a source region, and a drain region of an ESD protective device according to a third embodiment of the present invention.

FIG. 19 is a plan view showing the body region B, a source region, and a drain region of an ESD protective device according to a third embodiment of the present invention. The body region B of the third embodiment has a T shape made by dividing the body region B of the second embodiment into substantially half in a direction perpendicular to the first direction. Accordingly, in the third embodiment, the body connecting part BCP, the body contact region BCR, and the body contacts BC are provided only on one end side of the body region B. The body connecting part BCP is connected only one end of a plurality of body regions B.

In the third embodiment, the first width D1 between the source layer S and the drain layer D positioned comparatively distant from the body connecting part BCP is larger than the second width D2 between the source layer S and the drain layer D positioned comparatively close to the body connecting part BCP. Accordingly, the third embodiment can offer similar advantageous effects to the second embodiment.

Surely, the third embodiment can be combined with the first embodiment with ease.

Fourth Embodiment

Figure 9:
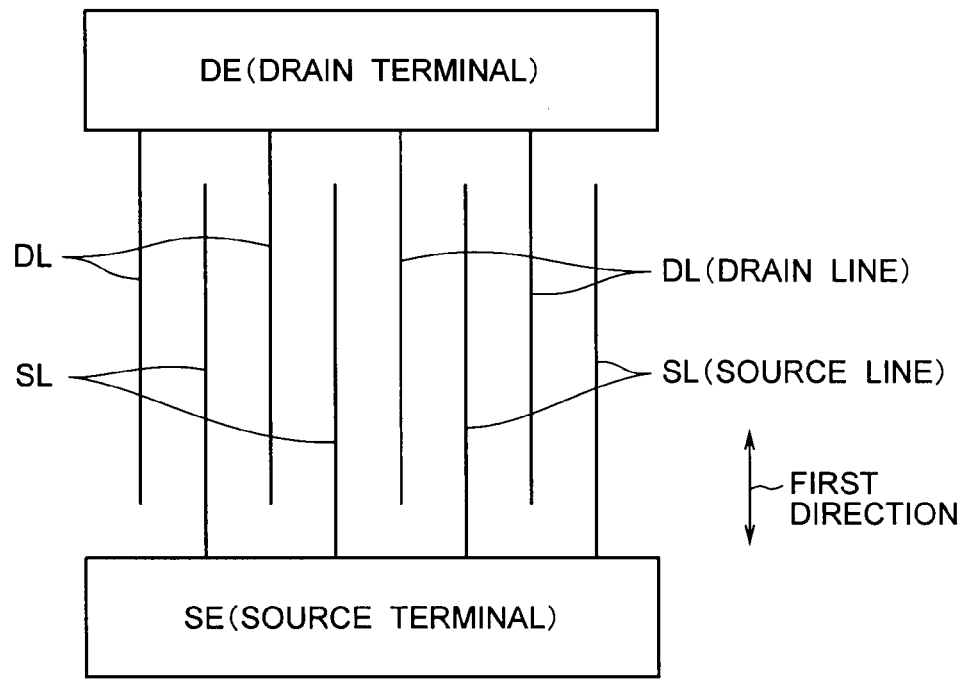
Figure 10:
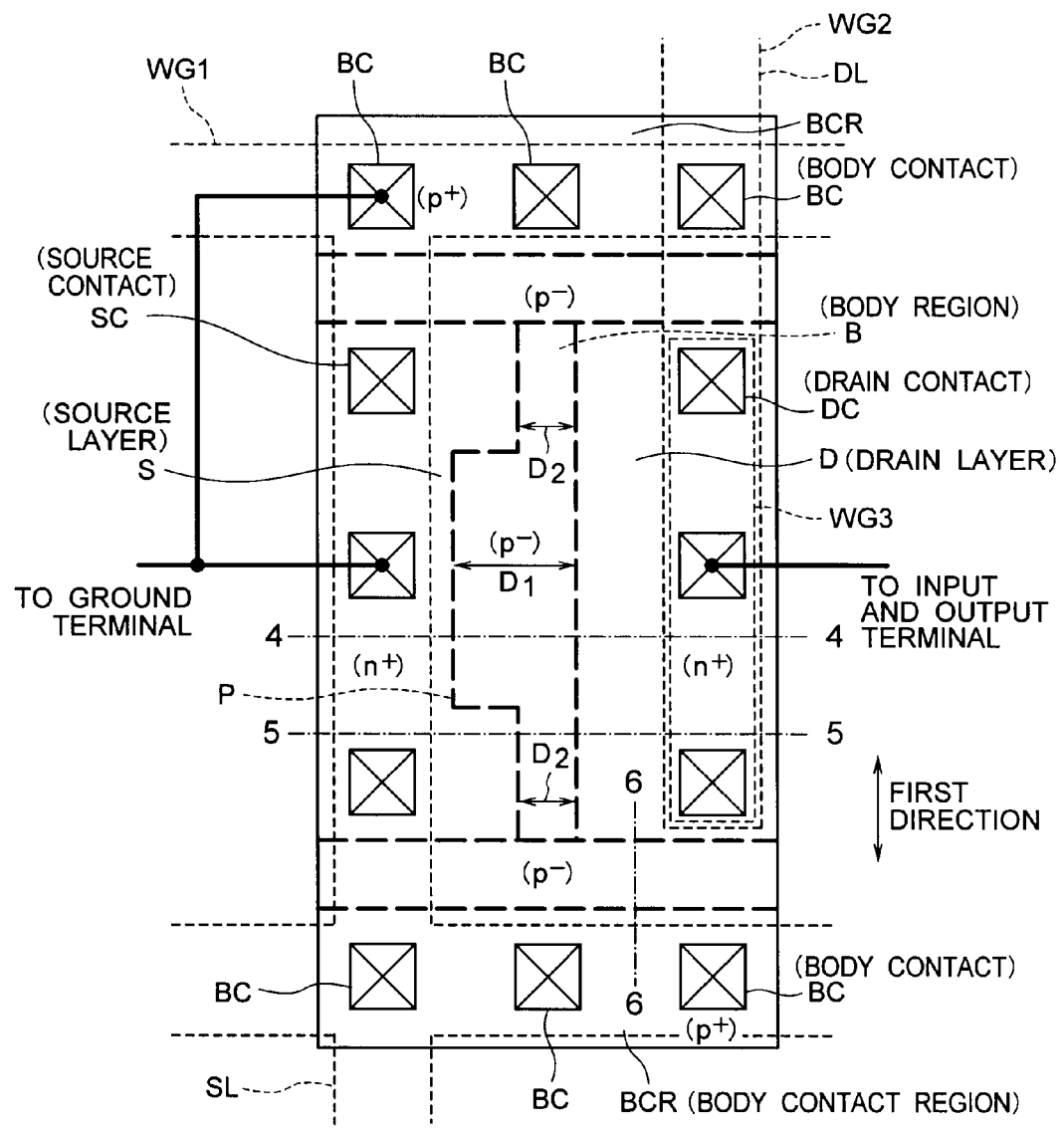
Figure 11:
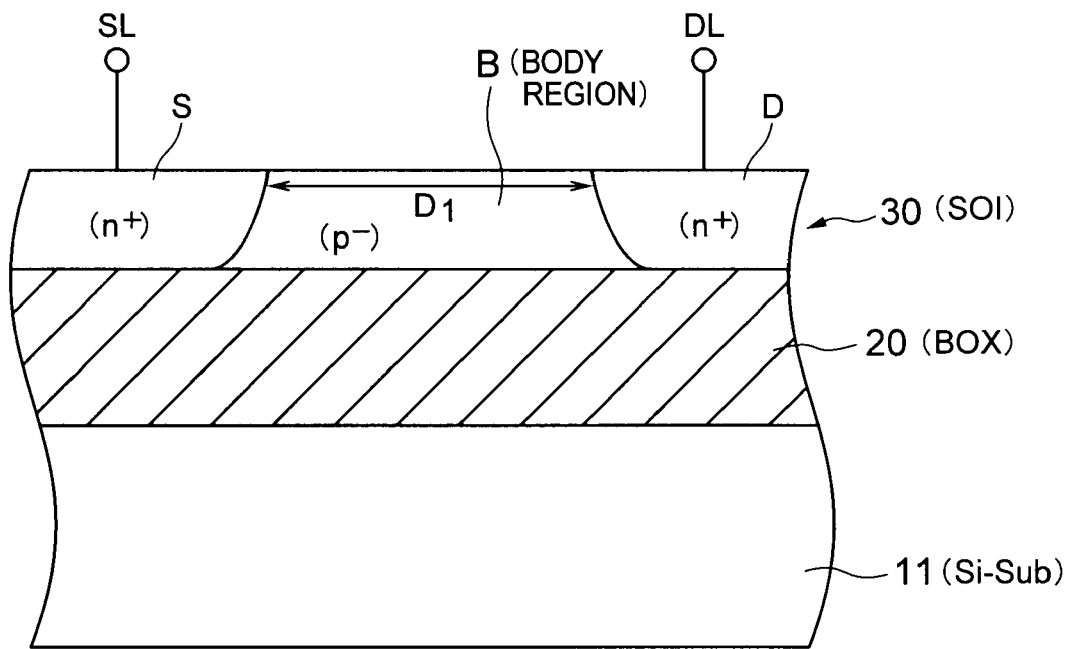
Figure 12:
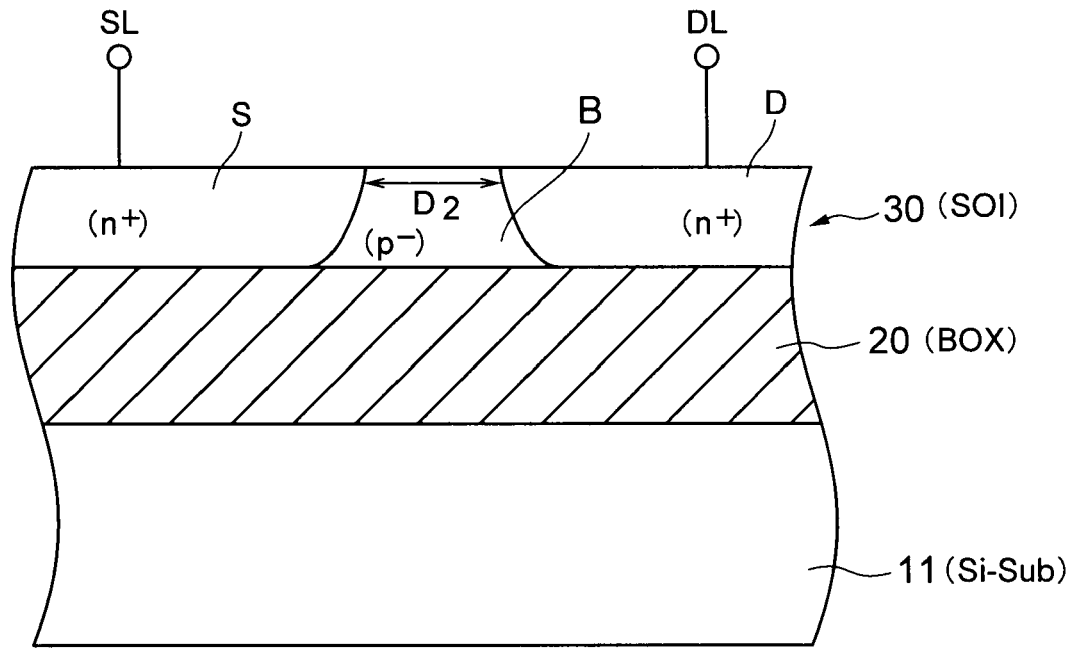
Figure 13:
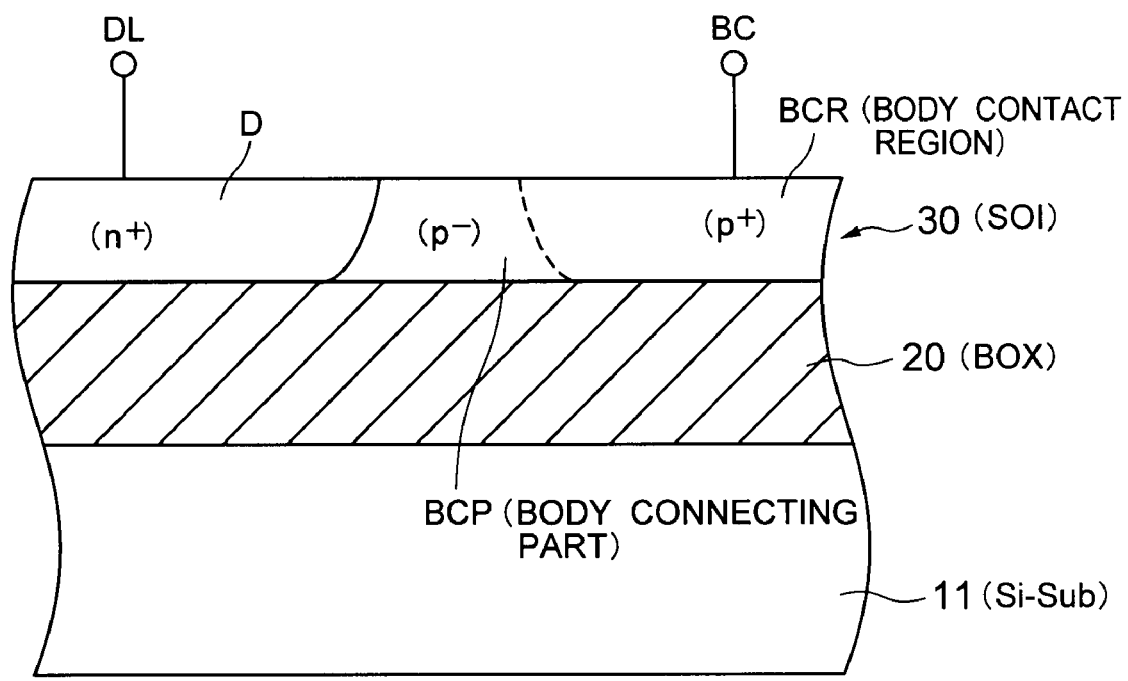
Figure 20:
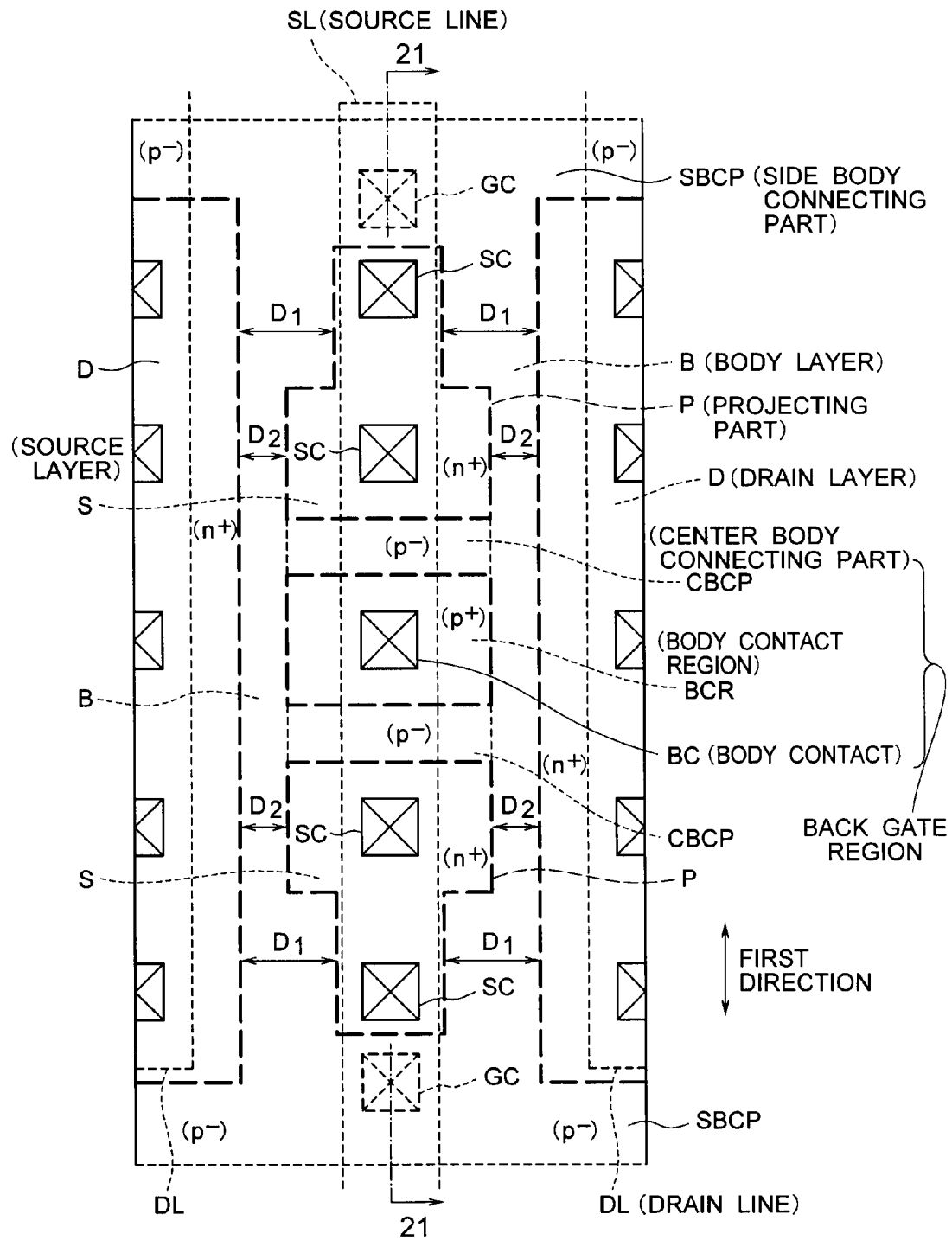
FIG. 20 is a plan view of an ESD protective circuit according to a fourth embodiment of the present invention.

FIG. 20 is a plan view of an ESD protective circuit according to a fourth embodiment of the present invention. The protective device according to the fourth embodiment has a pattern shown in FIG. 20 which appears from side to side iteratively. Thus, as shown in FIG. 1 or 9, the source lines SL and the drain lines DL are arrayed alternately. In the fourth embodiment, a back gate region including the body contact BC, the body contact region BCR, and a center body connecting part CBCP is provided at the middle part of the body region B extending in the first direction (at a portion between more than one such source layer S adjacent to each other in the first direction). The body contact BC and the body contact region BCR are provided to a portion between the source layers S adjacent to each other in the first direction in an island-like pattern. Accordingly, the width D1 at the end of the body region B comparatively distant from the back gate is larger than the width D2 at the middle part of the body region B comparatively close to the back gate. Thus, the fourth embodiment can offer similar advantageous effects to the second embodiment.

The configuration of the fourth embodiment includes the center body connecting parts CBCP adjacent to both sides of the body contact region BCR in the first direction, and side body connecting parts SBCP provided at both ends of the body region B, so as to connect the plurality of body regions adjacent in a direction perpendicular to the first direction. The center body connecting part CBCP connects two body regions provided between more than one such adjacent drain layer D. The side body connecting part SBCP extends in a direction perpendicular to the first direction across the drain layers D, and connects the plurality of adjacent body regions B electrically. Since the center body connecting part CBCP is interposed between the body contact region BCR of $p^+$ type and the source layer S of $n^+$ type, the fourth embodiment is preferable for reliability of the protective device.

In the fourth embodiment, the source contacts SC and the body contacts BC can be connected to the common source line SL. Therefore, the fourth embodiment provides wiring connection with ease. A first interlayer dielectric film (not shown) is deposited above the upper side of the source layer S, the drain layer D, and the body region B. The drain contacts DC, the source contacts SC, the gate contacts GC, and the body contacts BC are formed so as to penetrate the first interlayer dielectric film. Furthermore, first layer wiring is formed on the first interlayer dielectric film. The first layer wiring includes the source line SL and the drain line DL. The source line SL connects the source contacts SC, the gate contacts GC, and the body contacts BC to the source terminal SE. The drain line DL connects the drain contacts DC to the drain terminal DE.

Figure 21:
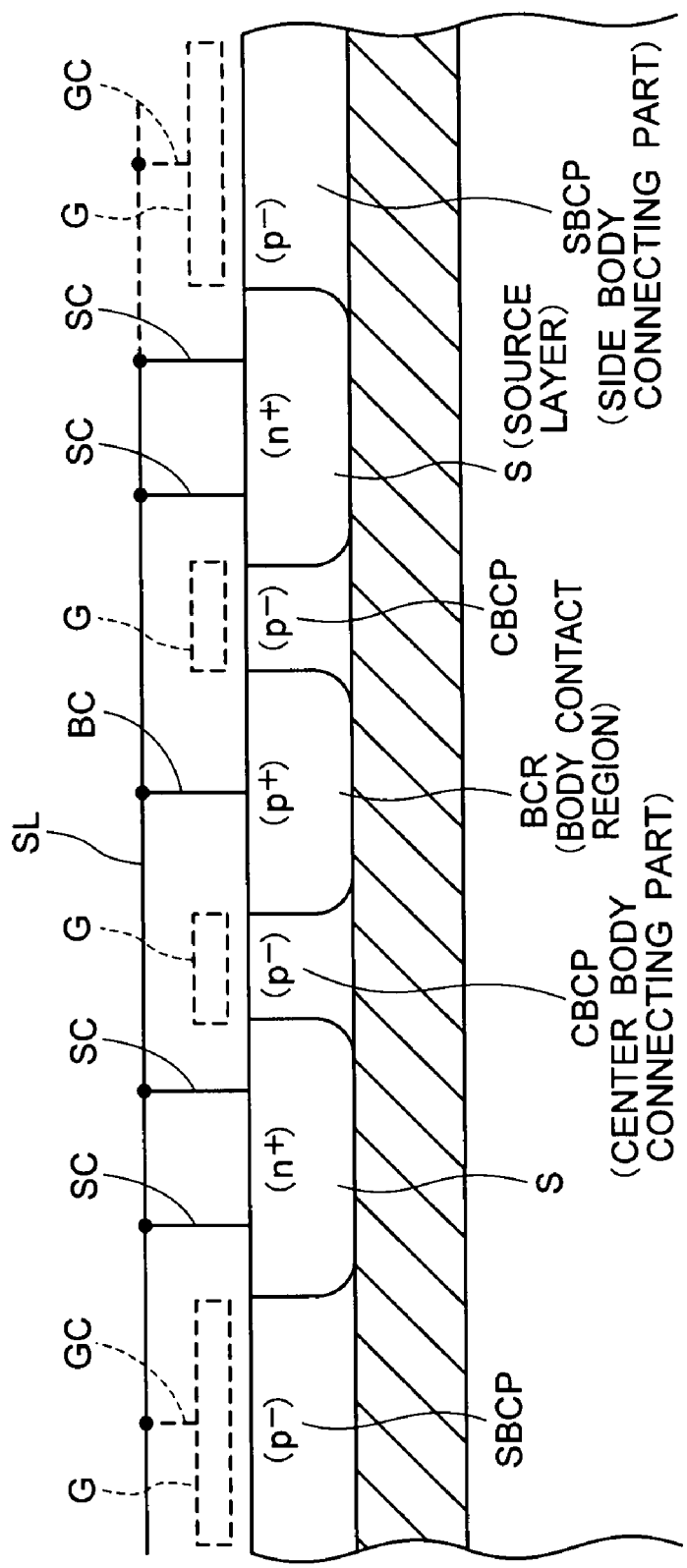
FIG. 21 is a cross-sectional view taken along the line 21-21 shown in FIG. 20.

FIG. 21 is a cross-sectional view taken along the line 21-21 shown in FIG. 20. The source layers S are provided at both sides of the body contact region BCR, and the center body connecting part CBCP is provided between the body contact region BCR and the source layers S. The side body connecting part SBCP is provided at the further external side of each source layer S. The source layer S and the body contact region BCR are connected to the source line SL via the source contacts SC and the body contacts BC, respectively. In the case where the gate electrode G (shown by dashed lines) is provided, the gate electrode G is connected to the source line SL via the gate contacts GC.

The configuration of the fourth embodiment may include the gate electrode G on the body region B in a manner overlapping with the body region B, and the gate connecting line GCL provided on the body connecting part BCP as in the first embodiment. In this case, the gate contacts GC are connected to the common source line SL with the source contacts SC and the body contacts BC. Therefore, the fourth embodiment provides wiring connection with comparative ease. FIG. 20 shows the position of the gate contacts GC with a dashed line.

In the fourth embodiment, even if a plurality of back gates is arrayed with a comparatively wide pitch, a current concentration can be suppressed. Therefore, the width of the discharge path of the body region B can be maintained wide.

In the fourth embodiment, since the back gate is provided at the middle part of the body region B, even if the length of the body region B in the first direction (the gate width) is enlarged, a current concentration at the body region B can be suppressed.

As described above, by increasing the width of a part of the body region B (the gate width), an increase in the base resistance of the parasitic bipolar transistor is suppressed. Variations in the on-voltage in the device are thus reduced, whereby the breakdown of the protective device due to the concentration of discharge current can be suppressed.

Fifth Embodiment

Figure 22:
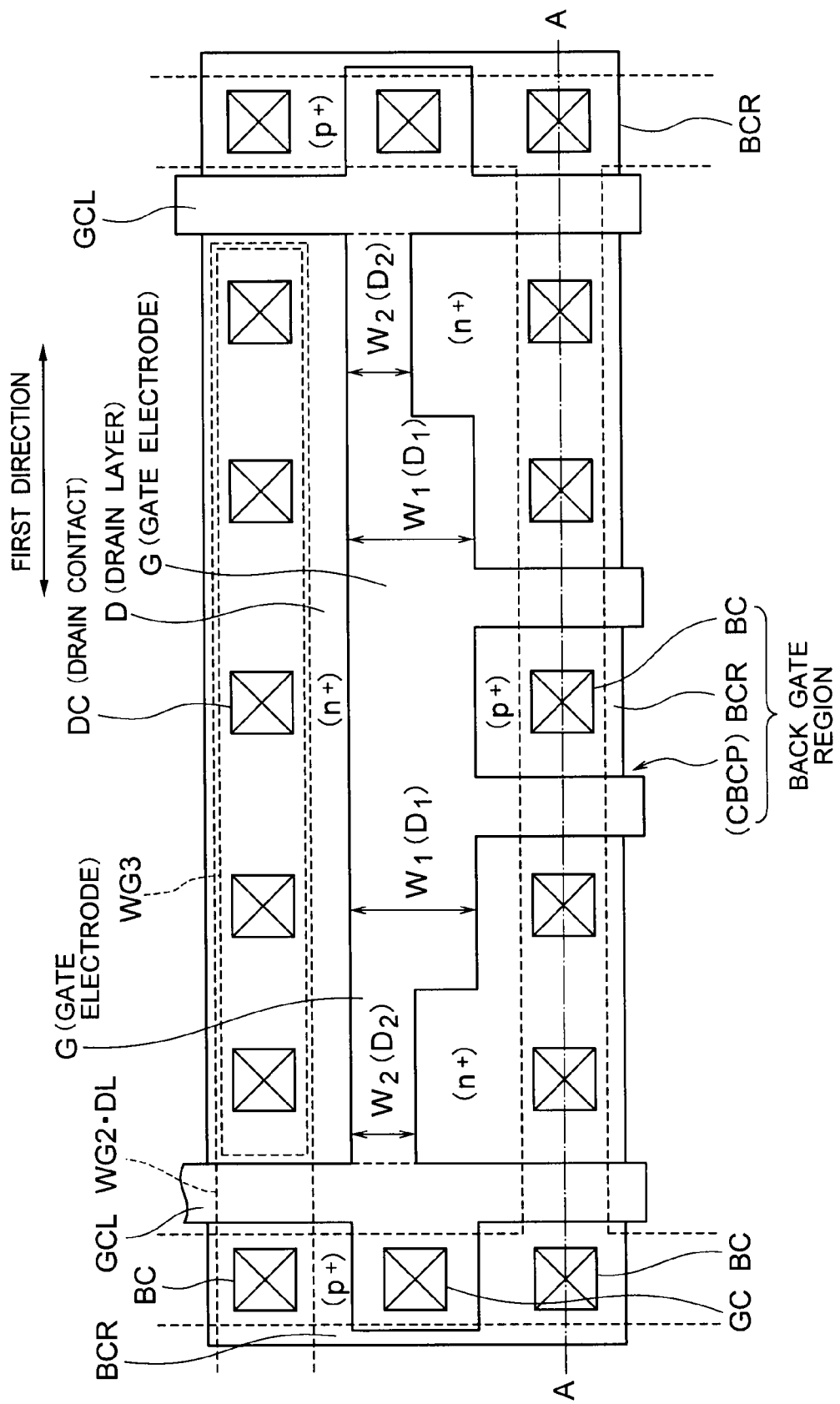
FIG. 22 is a plan view of an ESD protective circuit according to a fifth embodiment of the present invention.

FIG. 22 is a plan view of an ESD protective circuit according to a fifth embodiment of the present invention. The ESD protective circuit according to a fifth embodiment has a back gate region including the body contact BC, the body contact region BCR, and the center body connecting part CBCP at a middle part of the projecting part P of the body region B according to the first embodiment. That is, the fifth embodiment is a combination of the first embodiment and the fourth embodiment. The ends of the gate electrode G have same configurations as the gate electrode G according to the first embodiment shown in FIG. 1. The middle part of the gate electrode G (a peripheral portion of the back gate region) has a same configuration as the middle part of the gate electrode G according to the fourth embodiment shown in FIG. 20. The center body connecting parts CBCP are provided at middle parts of the body regions B in the first direction.

When a pattern shown in a right side of a A-A line shown in FIG. 22 is folded back centering around the A-A line, a pattern same as the back gate pattern shown in FIG. 20 can be obtained.

The fifth embodiment has a wide gate width in the gate electrode G and a back gate region in the middle part of the gate electrode G. Therefore, carriers in the middle part of the body B are easily drawn from the body connecting parts BCP in a middle part of the body region B via the wide portion of the body region B. Further, in the fifth embodiment, carriers are emitted from the body contact regions BCR positioned at both ends of the gate electrode G. Accordingly, the fifth embodiment can improve a capability of the carrier emission and can have a preferable protective property against to a positive and a negative voltages.

The fifth embodiment can obtain the advantages of the first and the fourth embodiments.

In FIG. 22, the gate electrode G is provided, however, the gate electrode G can be omitted same as the second and the fourth embodiments.

Figure 23:
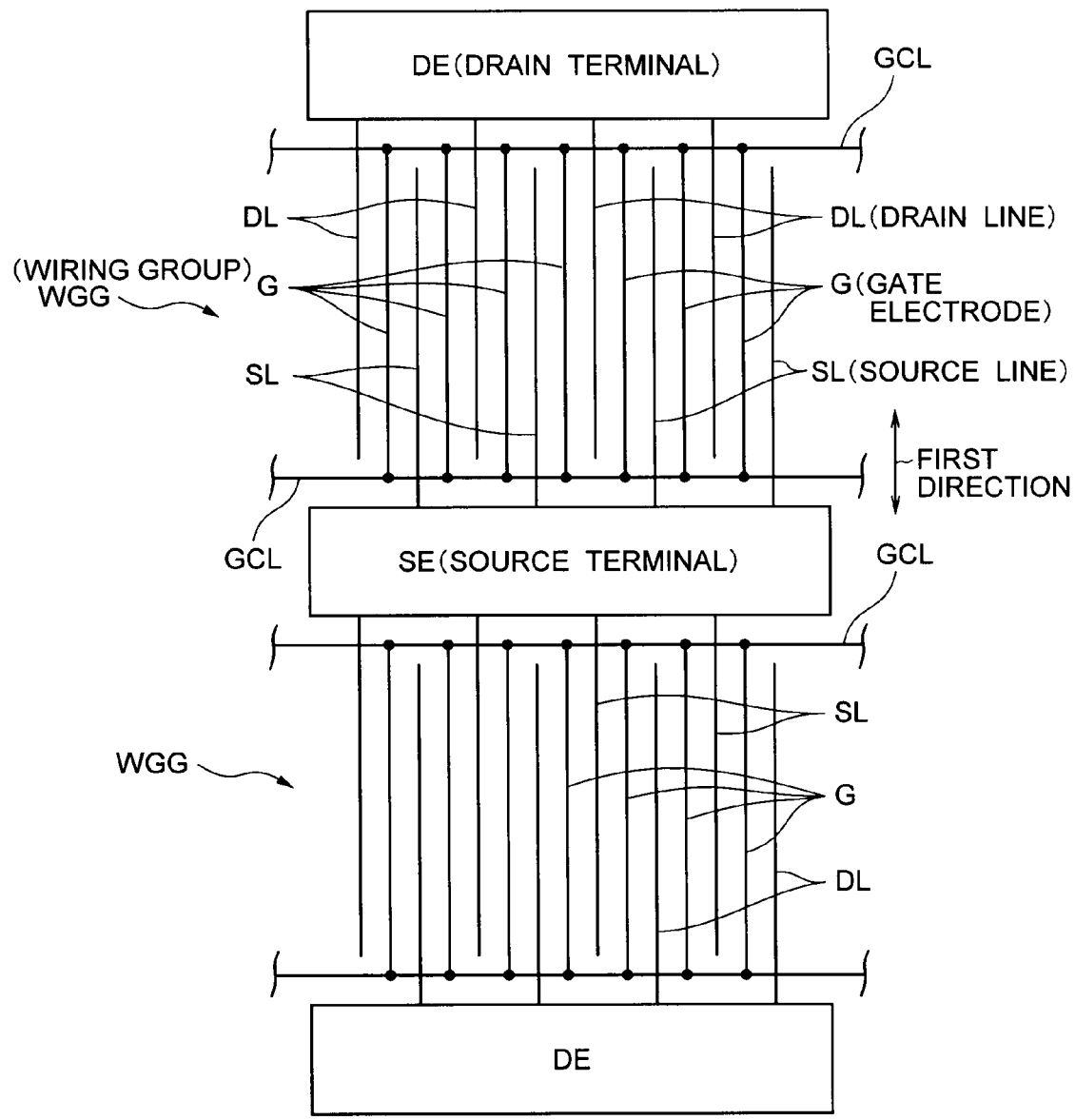
FIG. 23 shows a plurality of wiring groups WGG provided iteratively.

In the above embodiments, a plurality of wiring groups WGG, each composed of the gate electrodes G, the drain lines DL, and the source lines SL as shown in FIG. 2, may be provided iteratively in the first direction as shown in FIG. 23. In this case, the wiring groups WGG adjacent to each other in the first direction may share the source terminal SE. Furthermore, the planar configuration shown in FIG. 23 may be provided in a plural number. An alternative wiring group WGG, each composed of the drain lines DL and the source lines SL as shown in FIG. 9, may be provided iteratively in the first direction in a similar manner to FIG. 23.

The invention claimed is:

1. A semiconductor device connected to a protected device and protecting the protected device by using a portion between a source terminal and a drain terminal as a discharge path,
the semiconductor device comprising:
an insulating film;
a semiconductor layer provided on the insulating film;
a plurality of source layers which are formed in the semiconductor layer and extends in a first direction;
a plurality of drain layers which are formed in the semiconductor layer and extends along with the source layers;
a plurality of body regions which are provided between the source layers and the drain layers in the semiconductor layer and extends in the first direction; and
a plurality of body connecting parts respectively connecting the plurality of body regions, wherein
a first width between the source layers and the drain layers at a first position is larger than a second width between the source layers and the drain layers at a second position, the second position is closer to the body connecting parts than the first position,
widths at middle parts of the body regions are larger than widths at ends of the body regions.

2. The semiconductor device according to claim 1, wherein two of the body connecting parts are respectively provided at the ends of the body regions.

3. The semiconductor device according to claim 2, wherein the middle parts of the body regions project toward a source layer side within a surface of the semiconductor layer.

4. The semiconductor device according to claim 2, wherein the middle parts of the body regions project toward a drain layer side within a surface of the semiconductor layer.

5. The semiconductor device according to claim 2, wherein the middle part of the body region projects toward both a source layer side and a drain layer side within a surface of the semiconductor layer.

6. The semiconductor device according to claim 1, wherein sides of the middle parts of the body regions are projected and formed in a tapered shape within a surface of the semiconductor layer.

7. The semiconductor device according to claim 1, wherein the body regions have a varied width in multiple steps within a surface of the semiconductor layer.

8. The semiconductor device according to claim 1, wherein the body regions have tapered widths shaped gradually narrow from a center part thereof toward an end thereof within a surface of the semiconductor layer.

9. The semiconductor device according to claim 1, wherein two of the body connecting parts are provided so as to extend in a second direction substantially perpendicular to the first direction; and one of the body connecting parts is connected to one ends of the plurality of body regions, and the other of the body connecting parts is connected to the other ends of the plurality of body regions.

10. The semiconductor device according to claim 1, wherein the body connecting parts are provided at the middle parts of the body regions in the first direction; and widths at ends of the body regions are larger than widths of the middle parts of the body regions.

11. The semiconductor device according to claim 9 further comprising:

center body connecting parts provided at the middle parts of the body regions in the first direction, wherein widths of the middle parts of the body regions are larger than widths at the ends parts of the body regions.

12. The semiconductor device according to claim 1, further comprising:

gate electrodes overlapping on the body regions so as to have planar patterns similar to planar patterns of the body regions.

13. The semiconductor device according to claim 9, further comprising:

gate electrodes overlapping on the body regions so as to have planar patterns similar to planar patterns of the body regions, gate connecting lines overlapping on the body connecting parts so as to have planar patterns similar to planar patterns of the body connecting parts.

14. The semiconductor device according to claim 10, further comprising:

gate electrodes overlapping on the body regions so as to have planar patterns similar to planar patterns of the body regions, gate connecting lines overlapping on the body connecting parts so as to have planar patterns similar to planar patterns of the body connecting parts.

15. The semiconductor device according to claim 11, further comprising:

gate electrodes overlapping on the body regions so as to have planar patterns similar to planar patterns of the body regions, gate connecting lines overlapping on the center body connecting parts so as to have planar patterns similar to planar patterns of the center body connecting parts.

* * * * *